US009908991B2

(12) United States Patent
Fujimaki et al.

(10) Patent No.: US 9,908,991 B2
(45) Date of Patent: Mar. 6, 2018

(54) ORGANIC PIGMENT COMPOSITION FOR COLOR FILTERS, METHOD FOR PRODUCING THE SAME, AND COLOR FILTER

(71) Applicant: DIC Corporation, Tokyo (JP)

(72) Inventors: Masanori Fujimaki, Sakura (JP); Mayumi Tokuoka, Kamisu (JP); Akira Kimura, Kamisu (JP); Katsunori Shimada, Sakura (JP); Kayoko Fukushima, Takaishi (JP); Masaharu Takahashi, Takaishi (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 14/115,291

(22) PCT Filed: May 16, 2013

(86) PCT No.: PCT/JP2013/063680
§ 371 (c)(1),
(2) Date: Nov. 1, 2013

(87) PCT Pub. No.: WO2013/183419
PCT Pub. Date: Dec. 12, 2013

(65) Prior Publication Data
US 2015/0315361 A1 Nov. 5, 2015

(30) Foreign Application Priority Data
Jun. 8, 2012 (JP) ................................ 2012-130873

(51) Int. Cl.
C08K 5/3417 (2006.01)
G02B 5/20 (2006.01)
G02B 5/22 (2006.01)
C09B 67/46 (2006.01)
C09B 67/04 (2006.01)
G03F 7/00 (2006.01)
G03F 7/105 (2006.01)
C09B 17/00 (2006.01)
C09B 67/20 (2006.01)
C09B 67/22 (2006.01)
C09D 17/00 (2006.01)

(52) U.S. Cl.
CPC ........ C08K 5/3417 (2013.01); C09B 67/0002 (2013.01); C09B 67/0085 (2013.01); G02B 5/20 (2013.01); G02B 5/223 (2013.01); G03F 7/0007 (2013.01); G03F 7/105 (2013.01); C09D 17/003 (2013.01); G02B 5/201 (2013.01)

(58) Field of Classification Search
CPC .......... C08K 5/3417; G02B 5/20; G02B 5/22; C09B 17/00; C09B 67/20; C09B 67/22; C09B 67/46
USPC .................. 106/411; 252/582, 586; 313/504; 430/7, 287.1; 524/88
See application file for complete search history.

(56) References Cited

U.S. PATENT DOCUMENTS

| 4,272,607 A * | 6/1981 | Tsukada | G03F 7/033 430/285.1 |
| 2003/0144399 A1* | 7/2003 | Matta | C08F 230/02 524/419 |

FOREIGN PATENT DOCUMENTS

| JP | 08-179111 A | 7/1996 | |
| JP | 2001-122923 A | 5/2001 | |
| JP | 2003-138161 A | 5/2003 | |
| JP | 2003192977 * | 7/2003 | ............. C09D 17/00 |
| JP | 2004-101728 A | 4/2004 | |
| JP | 2005-195941 A | 7/2005 | |
| JP | 3797013 B2 | 7/2006 | |
| JP | 2006-328343 A | 12/2006 | |
| JP | 2012-252319 A | 12/2012 | |
| WO | 2006/118094 A1 | 11/2006 | |
| WO | 20101061830 A1 | 6/2010 | |
| WO | WO 2010061830 A1 * | 6/2010 | ............. C09B 47/061 |
| WO | WO 2011108496 A1 * | 9/2011 | ............. C09B 57/002 |

OTHER PUBLICATIONS

International Search Report, dated Jun. 11, 2013, issued in corresponding application No. PCT/JP2013/063680.
Written Opinion, dated Jun. 11, 2013, issued in corresponding application No. PCT/JP2013/063680.

* cited by examiner

Primary Examiner — Bijan Ahvazi
(74) Attorney, Agent, or Firm — Westerman, Hattori, Daniels & Adrian, LLP

(57) ABSTRACT

An organic pigment composition that allows a colored item to have good color saturation and high resistance to a change in hue even when subjected to a thermal history for a prolonged period. A color filter includes an organic pigment composition for color filters in a pixel portion. The organic pigment composition for color filters includes an organic pigment (A) having an average primary particle size of 100 nm or less; and a copolymer (B) of a (meth)acrylic acid ester having a phosphate group and another (meth)acrylic acid ester having no phosphate group, the amount of a nonvolatile component of the copolymer (B) being 0.1 to 15 parts relative to 100 parts of the organic pigment (A) on a mass basis.

11 Claims, No Drawings

US 9,908,991 B2

ORGANIC PIGMENT COMPOSITION FOR COLOR FILTERS, METHOD FOR PRODUCING THE SAME, AND COLOR FILTER

TECHNICAL FIELD

The present invention relates to an organic pigment composition for color filters, with which color filters having high resistance to changes in brightness and hue caused by heat are prepared, to a method for producing the organic pigment composition, and to a color filter that includes the pigment composition in pixel portions and that suppresses a reduction in brightness and a change in hue of an image even when subjected to a thermal history during production of the color filter at a high temperature.

BACKGROUND ART

A color filter for liquid-crystal display apparatuses include red pixel portions (R), green pixel portions (G), and blue pixel portions (B). These pixel portions each have a structure in which a thin film composed of a synthetic resin including an organic pigment dispersed therein is disposed on a substrate. These red, green, and blue pixel portions respectively include red, green, and blue organic pigments as the organic pigment.

There has been a demand for organic pigments used for producing color filters which have characteristics completely different to those required for conventional general-purpose applications. Specifically, for example, there has been a demand for a display of a liquid-crystal display apparatus that is clearer (increase in contrast) or brighter (increase in brightness) than existing displays. In order to meet these demands, organic pigments that are fine powders having an average primary particle size of 100 nm or less are often used.

However, on the other hand, the smaller the pigments, the larger the surface area of the pigments. This increases surface energy, which results in aggregation of the organic pigment due to a thermal history during production of the color filter. As a result, brightness and contrast are disadvantageously reduced.

Accordingly, a surface treatment using an organic pigment derivative, a surfactant, or a synthetic resin is commonly performed in order to impart heat resistance. This surface treatment improves the dispersibility, dispersion stability, and heat resistance of an organic pigment that has not yet been subjected to any surface treatment.

Examples of known methods for surface treatment include a kneading method, an acid/alkaline precipitation method, and a heating under pressure method. Specifically, a method in which an organic pigment is subjected to solvent-salt-milling in the presence of the nonvolatile component of an acrylic resin is known.

The surface treatment for an organic pigment using a synthetic resin has been studied for polymers belonging to each category, which are roughly divided into (meth)acrylic resins, epoxy resins, polyester resins, polyurethane resins, and the like. However, systematical studies on a category of polymer that has markedly improved dispersibility and dispersion stability and on the structure of a polymer that selectively has the best improved dispersibility and dispersion stability described above among polymers of a specific category have not been conducted and thus there are many unclear points.

However, because a fine organic pigment are more likely to cause aggregation than general-purpose organic pigments, the method of surface treatment for organic pigments used for general purposes does not always achieve the intended improvement effect regardless of the type of synthetic resin used. In reality, a synthetic resin that belongs to an optimal category and that has an optimal structure is selected by trial and error.

Specifically, examples of methods for surface treatment for an organic pigment used in preparation of color resists for color filters include a method in which a rosin ester and an organic pigment are subjected to solvent-salt-milling (PTL 1) and a method in which an organic pigment is subjected to heating under pressure in the presence of a polyurethane resin in a liquid medium (PTL 2). In addition, an organic pigment composition including copper phthalocyanine, bromo-chloro copper phthalocyanine, and a resin having a phosphate group is described (PTL 3).

CITATION LIST

Patent Literature

PTL 1: Japanese Unexamined Patent Application Publication No. 8-179111
PTL 2: International Publication No. WO10/061830
PTL 3: Japanese Patent No. 3797013

SUMMARY OF INVENTION

Technical Problem

However, in the above-described production methods, that is, the solvent-salt-milling method and the heating under pressure method, an adequate resin is not used in the treatment, which results in insufficient heat resistance to a thermal history during production of a panel. In addition, the above-described organic pigment surface-treated with a specific resin including a phosphate group is a coloring item used for paint and ink, and thus, in reality, the resulting pigment particles are large and brightness is low as color filters.

Solution to Problem

In order to address the above-described problems, the inventors of the present invention have conducted extensive studies on the effect of the surface treatment for an organic pigment using several kinds of synthetic resins and found the following. A coloring item free from the above-described problems can be produced by performing a surface treatment using a copolymer of a (meth)acrylic acid ester having a phosphate group and another (meth)acrylic acid ester having no phosphate group. In particular, when this coloring item is used for a color filter used in a liquid-crystal display apparatus that is exposed to high temperature for a prolonged period during the manufacturing process or under operating conditions, a color filter that realizes liquid-crystal display having high resistance to a change in brightness caused by heat can be produced. Thus, the present invention has been completed.

Specifically, the present invention provides an organic pigment composition including an organic pigment (A) having an average primary particle size of 100 nm or less; and a copolymer (B) of a (meth)acrylic acid ester having a phosphate group and another (meth)acrylic acid ester having no phosphate group. The amount of the nonvolatile component of the copolymer (B) is 0.1 to 15 parts relative to 100 parts of the organic pigment (A) on a mass basis.

The present invention also provides a method for producing the organic pigment composition, the method including, in a liquid medium, heating under pressure the organic pigment (A) in a presence of the nonvolatile component of the copolymer (B) of a (meth)acrylic acid ester having a phosphate group and another (meth)acrylic acid ester having no phosphate group; or solvent-salt-milling the organic pigment (A) in a presence of the nonvolatile component of the copolymer (B) of a (meth)acrylic acid ester having a phosphate group and another (meth)acrylic acid ester having no phosphate group.

The present invention further provides a color filter including any one of the above-described organic pigment compositions in a pixel portion.

Advantageous Effects of Invention

The organic pigment composition according to the present invention includes an organic pigment (A) and a specific copolymer (B) at a certain ratio and thereby produces a remarkable technical advantage in that the color difference of the colored item is small even when subjected to a thermal history for a prolonged period, that is, a colored item having high resistance to a change in coloring property caused by heat can be produced.

The method for producing the organic pigment composition according to the present invention produces a remarkable technical advantage in that the above-described organic pigment composition can be easily produced.

The color filter according to the present invention includes the above-described organic pigment composition or an organic pigment composition produced by the above-described production method in pixel portions and thereby produces a remarkable technical advantage in that the color filter realizes liquid-crystal display having high resistance to a change in brightness caused by heat.

BEST MODE FOR CARRYING OUT THE INVENTION

An organic pigment composition for color filters according to the present invention includes a copolymer (B) of a (meth)acrylic acid ester having a phosphate group and another (meth)acrylic acid ester having no phosphate group. The amount of the nonvolatile component of the copolymer (B) is 0.1 to 15 parts relative to 100 parts of an organic pigment (A) on a mass basis.

Any publicly known and commonly used organic pigments may be used as the organic pigment (A), and examples thereof include a phthalocyanine pigment, a quinacridone pigment, an azo pigment, a dioxazine pigment, an anthraquinone pigment, a diketopyrrolopyrrole pigment, and an organometallic complex pigment.

The organic pigment (A) according to the present invention preferably has the average particle size of primary particles of 100 nm or less because the high brightness and high contrast of color filters are required. The average particle size of primary particles is more preferably 80 nm or less because clearer colored items are likely to be produced. On the other hand, generally, the smaller the particle size of the organic pigment (A), the lower the heat resistance of the organic pigment (A) tends to be. Therefore, the heat resistance needs to be improved in some way without degrading the clarity of the colored item.

In the present invention, the average particle size of primary particles is determined in the following manner. First, an image of particles in the field of view is taken using a transmission electron microscope or a scanning electron microscope. Then, for each 50 primary particles constituting aggregates on the resulting two-dimensional image, the greatest length (maximum length) among the inner diameters of the 50 primary particles is determined. The average of the maximum lengths is considered as the average particle size of primary particles.

Any publicly known and commonly used (meth)acrylic acid esters may be used for the copolymer (B) of a (meth)acrylic acid ester having a phosphate group and another (meth)acrylic acid ester having no phosphate group.

The (meth)acrylic acid ester is a compound that has an ester linkage formed of a (meth)acrylic acid and any of various alcohols and that has a chain of carbon atoms derived from the alcohol at an end of an ester linkage COO. Typically, a (meth)acrylic acid ester in which the chain of carbon atoms is an alkyl group is referred to as (meth)acrylic acid alkyl ester. In a (meth)acrylic acid alkyl ester, a side chain means an alkyl group. Compounds having a carbon chain other than an alkyl group are known as well as the (meth)acrylic acid alkyl ester in the industry. Therefore, in the present invention, (meth)acrylic acid ester also refers to the compounds having a carbon chain other than an alkyl group in addition to a (meth)acrylic acid alkyl ester.

Examples of the (meth)acrylic acid ester having a phosphate group include acid phosphoxyethyl methacrylate, acid phosphoxypropyl methacrylate, acid phosphoxy polyoxyethylene glycol monomethacrylate, acid phosphoxy polyoxypropylene glycol monomethacrylate, ethylene glycol methacrylate phosphate, propylene glycol methacrylate phosphate, ethylene glycol acrylate phosphate, and propylene glycol acrylate phosphate. Examples of commercially available (meth)acrylic acid esters having a phosphate group include Phosmer M, Phosmer CL, Phosmer PE, and Phosmer MH (produced by Uni-Chemical Co., Ltd.); LIGHT ESTER P-1M (produced by Kyoeisha Chemical Co., Ltd.); JAMP-514 (produced by Johoku Chemical Co., Ltd.); and KAYAMER PM-2 and KAYAMER PM-21 (produced by Nippon Kayaku Co., Ltd.).

Examples of the (meth)acrylic acid ester having no phosphate group include (meth)acrylic acid alkyl esters having an alkyl group such as methyl (meth)acrylate, ethyl (meth)acrylate, n-propyl (meth)acrylate, iso-propyl (meth)acrylate, n-butyl (meth)acrylate, isobutyl (meth)acrylate, tert-butyl (meth)acrylate, 2-ethylhexyl (meth)acrylate, n-octyl (meth)acrylate, dodecyl (meth)acrylate [lauryl (meth)acrylate], and octadecyl (meth)acrylate [stearyl (meth)acrylate]; (meth)acrylic acid esters having an alicyclic group such as cyclohexyl (meth)acrylate, isobornyl (meth)acrylate, adamantyl (meth)acrylate, and dicyclopentanyl (meth)acrylate;

(meth)acrylic acid esters having an ether group such as methoxytriethylene glycol (meth)acrylate, methoxypolyethylene glycol #400 (meth)acrylate, methoxydipropylene glycol (meth)acrylate, methoxytripropylene glycol (meth)acrylate, methoxypolypropylene glycol (meth)acrylate, ethyl carbitol (meth)acrylate, 2-ethylhexyl carbitol (meth)acrylate, tetrahydrofurfuryl (meth)acrylate, phenoxyethyl (meth)acrylate, phenoxydiethylene glycol (meth)acrylate, p-nonylphenoxyethyl (meth)acrylate, and p-nonylphenoxy polyethylene glycol (meth)acrylate; and (meth)acrylic acid esters having an aromatic ring, such as benzyl (meth)acrylate.

The copolymer (B) of a (meth)acrylic acid ester having a phosphate group and another (meth)acrylic acid ester having no phosphate group according to the present invention is a polymer produced by copolymerization of a (meth)acrylic acid ester having a phosphate group and another (meth)acrylic acid ester having no phosphate group.

The copolymer (B) is preferably a copolymer having a glass-transition temperature (Tg) of 0° C. to 150° C. because, when the copolymer (B) is used in combination with the organic pigment (A), high heat resistance is realized due to the interaction therebetween although the copolymer (B) has higher heat resistance when the glass-transition temperature (Tg) of the copolymer (B) is high.

The copolymer (B) may be of any molecular weight. However, specifically, the copolymer (B) is preferably a copolymer having a weight-average molecular weight of 5,000 to 100,000 because such a copolymer has a high affinity to the organic pigment (A) and thus has an effect of greatly improving heat resistance.

The copolymer (B) may be synthesized by any of various known reaction methods such as bulk polymerization, solution polymerization, suspension polymerization, and emulsion polymerization. In the synthesis of the copolymer (B), publicly known and commonly used polymerization initiators, surfactants, and antifoaming agents may be used in combination.

The copolymer (B) may be formed by copolymerization of the above-described (meth)acrylic acid ester having a phosphate group and (meth)acrylic acid ester having no phosphate group, which serve as essential monomers, with other comonomers capable of copolymerization with the essential monomers.

Examples of such other comonomers include vinyl esters such as vinyl acetate, vinyl propionate, and vinyl tertiary carboxylate; heterocyclic vinyl compounds such as vinyl pyrrolidone; cyano group-containing monomers such as halogenated olefins including vinyl chloride, vinylidene chloride, and vinylidene fluoride, acrylonitrile, and methacrylonitrile; vinyl ethers such as ethyl vinyl ether and isobutyl vinyl ether; vinyl ketones such as methyl vinyl ketone; α-olefins such as ethylene and propylene; dienes such as butadiene and isoprene; and styrenic monomers such as styrene, vinyltoluene, α-methylstyrene, dimethylstyrene, tert-butylstyrene, and chlorostyrene.

The copolymer (B) is preferably a copolymer including a monomer having a phosphate group in a proportion of 3% to 35% by mass based on 100% of all the monomers constituting the above-described copolymer (B) of a (meth)acrylic acid ester having a phosphate group and another (meth)acrylic acid ester having no phosphate group on a mass basis in order to realize higher heat resistance than a copolymer of a (meth)acrylic acid ester having no phosphate group and to improve dispersibility in a medium to be colored.

In a copolymer including the monomer having a phosphate group in a proportion of 3% to 35% by mass based on the total mass of all the monomers, the higher the proportion of the monomer having a phosphate group, the smaller the changes in color saturation and chromaticity when subjected to a thermal history tends to be.

An organic pigment composition according to the present invention includes the copolymer (B) of a (meth)acrylic acid ester having a phosphate group and another (meth)acrylic acid ester having no phosphate group so that the amount of the nonvolatile component of the copolymer (B) is 0.1 to 15 parts relative to 100 parts of the organic pigment (A) on a mass basis. In particular, the amount of the nonvolatile component of the copolymer (B) is preferably 0.5 to 12 parts and more preferably 1 to 10 parts relative to 100 parts of the organic pigment (A) in order to produce an organic pigment composition that realizes the technical advantages according to the present invention, other technical advantages such as dispersibility in a medium to be colored and dispersion stability, and economy in the most balanced manner by adding the copolymer (B).

The above-described organic pigment composition according to the present invention can be prepared by mixing the organic pigment (A) with the copolymer (B) by any method. Simple preparation methods are, for example, a method in which the organic pigment (B) and the nonvolatile component of the copolymer (B) are mixed with each other and a method in which the organic pigment (A) is mixed in a solution prepared by dissolving the copolymer (B) in a liquid medium and the resulting mixture is stirred, filtered, and dried.

However, the inventors of the present invention have been the first to find that an organic pigment composition prepared by a method with which a stronger interaction between the organic pigment (A) and the copolymer (B) is expected than by the simple preparation method has an effect of more greatly improving heat resistance than an organic pigment composition prepared by the simple preparation method described above. Specifically, the method is a method of heating under pressure the organic pigment (A) in a liquid medium in the presence of the nonvolatile component of the copolymer (B) of a (meth)acrylic acid ester having a phosphate group and another (meth)acrylic acid ester having no phosphate group or a method of solvent-salt-milling the organic pigment (A) in the presence of the nonvolatile component of the copolymer (B) of a (meth)acrylic acid ester having a phosphate group and another (meth)acrylic acid ester having no phosphate group. Hereafter, the former preparation method is referred to as heating under pressure method and the latter preparation method is referred to as solvent-salt-milling method.

The above-described two methods for producing the organic pigment composition according to the present invention are particularly useful in order to produce, as the organic pigment (A), organic pigments such as diketopyrrolopyrrole pigments; azo pigments including azo, disazo, and polyazo; phthalocyanine pigments including copper phthalocyanine, halogenated copper phthalocyanines, and metal-free phthalocyanines; anthraquinone pigments including aminoanthraquinone, diaminodianthraquinone, anthrapyrimidine, flavanthrone, anthanthrone, indanthrone, pyranthrone, and violanthrone; quinacridone pigments; dioxazine pigments; perinone pigments; perylene pigments; thioindigo pigments; isoindoline pigments; isoindolinone pigments; quinophthalone pigments; threne pigments; and metal-complex pigments organic pigment, in addition to carbon blacks such as acetylene black, channel black, and furnace black; and other organic pigments in general.

First, the heating under pressure method is described. In the heating under pressure method, for example, the organic pigment (A) is mixed in a solution or dispersion prepared by dissolving or dispersing the copolymer (B) in a liquid medium under stirring and then the resulting mixture is heated. This method allows the surface of the organic pigment (A) to be more uniformly coated with the copolymer (B) with more certainty than a method in which heating is not performed. In addition, heating under pressure promotes not only coating of the surface of the organic pigment (A) with the copolymer (B), which can also be achieved by performing simple heating, but also the penetration of the copolymer (B) into cavity portions such as pores present in the particles of the organic pigment (A), which further improves coating effect.

In this case, water or a liquid medium containing water as a main component and a water-soluble organic solvent (that is, aqueous medium) is preferably used as the liquid medium because a change in the crystal shape or the like of the organic pigment (A) itself becomes smaller compared with the case where the above-described mixing and heating are performed using only an organic solvent as the liquid medium, which reduces a change in hue.

Examples of the above-described water-soluble organic solvent include propylene glycol monomethyl ether acetate, ethyl alcohol, isopropyl alcohol, and isobutyl alcohol.

The amount of the aqueous medium used in heating under pressure is preferably much larger than the amount of the organic pigment (A) and is more preferably 15 to 100 parts by mass per part of the organic pigment (A) on a mass basis in order to maximize the effect produced by heating under pressure and to increase the amount of charged copolymer (B) that is used for coating of the organic pigment, thereby suppressing an outflow of the copolymer (B) in a filtration step described below and shortening time required for the filtration step.

In the case where an organic pigment composition is prepared from the organic pigment (A) and the copolymer (B) by the heating under pressure method, the organic pigment (A) and the copolymer (B) are charged so that the finally produced organic pigment composition includes 0.5 to 12 parts of the copolymer (B) relative to 100 parts of the organic pigment (A) on a mass basis. Strong interaction between the organic pigment (A) and copolymer (B), such as adsorption therebetween, prevents the outflow of the nonvolatile component of the charged copolymer (B), and as a result at least 70% of the nonvolatile component of the copolymer (B) on a mass basis remains in the organic pigment (A).

After being mixed with each other, the organic pigment (A) and the copolymer (B) may be heated in a closed system under stirring at 100° C. to 150° C. for 30 minutes to 5 hours. This heating in a closed system creates a pressurized state, which allows the copolymer (B) to penetrate into the cavities in the pigment particles as described above. This produces a more advantageous effect than just simply coating the particle surfaces.

Next, the solvent-salt-milling method is described. In the solvent-salt-milling method, for example, the organic pigment (A) and the copolymer (B) are kneaded with a water-soluble inorganic salt and a hydrophilic organic solvent by applying a mechanical stress. This greatly reduces the size of the organic pigment (A) particles and causes the particles to be formed into a substantially cubic shape, thereby allowing the surface of the organic pigment (A) to be uniformly coated with the copolymer (B) with certainty.

In the solvent salt milling, specifically, an organic pigment, a water-soluble inorganic salt, and a hydrophilic organic solvent in which the water-soluble inorganic salt cannot be dissolved are charged in a kneader, and these compounds are kneaded and ground in the kneader.

In the case where an organic pigment composition is prepared from the organic pigment (A) and the copolymer (B) by the solvent-salt-milling method, the organic pigment (A) and the copolymer (B) are charged so that the finally produced organic pigment composition includes 0.5 to 12 parts of the copolymer (B) relative to 100 parts of the organic pigment (A) on a mass basis. As in the heating under pressure method, strong interaction between the organic pigment (A) and copolymer (B), such as adsorption therebetween, suppresses the outflow of the nonvolatile component of the blended copolymer (B), and as a result at least 70% of the nonvolatile component of the copolymer (B) on a mass basis remains in the organic pigment (A).

The water-soluble inorganic salt is preferably an inorganic salt such as sodium chloride, potassium chloride, or sodium sulfate. The water-soluble inorganic salt is more preferably an inorganic salt having an average particle size of 0.5 to 50 µm, and such an inorganic salt can be easily produced by crushing an ordinary inorganic salt into file particles.

The amount of the inorganic salt used is preferably 8 to 20 parts and more preferably 10 to 15 parts per part of the organic pigment (A) on a mass basis.

The water-soluble organic solvent is preferably a water-soluble organic solvent capable of suppressing crystal growth, and examples thereof include diethylene glycol, glycerin, ethylene glycol, propylene glycol, liquid polyethylene glycol, liquid polypropylene glycol, 2-(methoxymethoxy)ethanol, 2-butoxyethanol, 2-(isopentyloxy)ethanol, 2-(hexyloxy)ethanol, diethylene glycol monomethyl ether, diethylene glycol monoethyl ether, diethylene glycol monobutyl ether, triethylene glycol, triethylene glycol monomethyl ether, 1-methoxy-2-propanol, 1-ethoxy-2-propanol, dipropylene glycol, dipropylene glycol monomethyl ether, dipropylene glycol monomethyl ether, dipropylene glycol, triethylene glycol, polyethylene glycol, 1,2-propanediol, and 1-methoxy-2-propanol. Ethylene glycol and diethylene glycol are preferable.

The amount of the water-soluble organic solvent used is not particularly limited but preferably 0.01 to 5 parts per part of the organic pigment (A) on a mass basis.

The kneading temperature is preferably 60° C. to 150° C. In this case, reductions in heat resistance, contrast, and the like, which are described below, can be suppressed. Therefore, the resulting organic pigment composition is suitably used for color filters.

Examples of a machine used for kneading include a kneader, Mix Muller, TRI-MIX (trademark) produced by INOUE MFG., INC. that is a planetary mixer disclosed in Japanese Unexamined Patent Application Publication No. 2007-100008, a continuous twin-screw extruder disclosed in Japanese Unexamined Patent Application Publication No. 4-122778, and MIRACLE KCK produced by ASADA IRON WORKS. CO., LTD. that is a single-screw kneading machine disclosed in Japanese Unexamined Patent Application Publication No. 2006-306996.

When the organic pigment (A) is a phthalocyanine pigment, the organic pigment composition may be prepared by the heating under pressure method or the solvent-salt-milling method. In order to produce an organic pigment composition containing a metal phthalocyanine pigment as the organic pigment (A), the solvent-salt-milling method is preferably employed. In order to produce an organic pigment composition containing a halogenated metal phthalocyanine pigment as the organic pigment (A), the heating under pressure method is preferably employed.

In either case where the heating under pressure method or the solvent-salt-milling method is employed, a mixture heated or kneaded under heating in a liquid medium is, for example, cooled to remove the liquid medium from the mixture and, as needed, solid matters are cleaned, filtered, dried, and then crushed. Thus, a powder of the organic pigment composition according to the present invention including the organic pigment (A) and the nonvolatile component of the copolymer (B) can be produced.

Cleaning may be performed by water washing or hot-water washing. Cleaning may be performed repeatedly one to five times. The copolymer (B) that is not adsorbed to the organic pigment (A) can be easily removed by cleaning.

Acid cleaning, alkali cleaning, or solvent cleaning may be performed as needed so as not to change the crystal state. The amount of the nonvolatile component of the copolymer (B), which is an active constituent, included in the organic pigment composition, (i.e., yield) can be estimated from, for example, the amount of a copolymer extracted by solvent extraction of the organic pigment composition or the amount of the copolymer (B) flowed out into a filtrate relative to the amount of the charged copolymer (B).

Drying subsequent to the above-described filtration and cleaning may be performed by batch-type drying, continuous-type drying, or the like in which water and/or a solvent is removed from the pigment by, for example, heating at 80° C. to 120° C. using a heat source installed in a dryer. Examples of the dryer generally include a compartment dryer, a band dryer, and a spray dryer. In particular, drying with a spray drier realizes easy dispersion in preparation of a paste. Crushing subsequent to drying is performed in order to crush the pigment into a powder when the pigment is in the form of a lump such as in the case where the drying is performed using, for example, a compartment dryer or a band dryer, but not to increase the specific surface area of the pigment or reduce the average particle size of primary particles. Crushing may be performed using, for example, a mortar, a hammer mill, a disk mill, a pin mill, a jet mill, or the like. Thus, a dry powder containing, as a main component, the organic pigment composition including the organic pigment (A) and the copolymer (B) is produced.

The organic pigment composition according to the present invention has high dispersibility and dispersion stability in a liquid medium and forms a pigment dispersion described below having a low viscosity. The pigment dispersion has stably high Newtonian flowability because the organic pigment is dispersed in the pigment dispersion in the form of file particles. Therefore, for example, when pixel portions of a color filter are produced from the organic pigment composition, a homogeneous coating film can be formed and thereby color filters having high brightness, high contrast, and high light permeability can be produced.

When the organic pigment composition according to the present invention described above is used to color a medium to be colored, the colored item is vivid, i.e., has good color saturation, and the change in hue of the colored item is not large even when subjected to a thermal history for a prolonged period, i.e., has high heat resistance. Therefore, the organic pigment composition according to the present invention is suitably used for coloring, as well as for pixel portions of a color filter, paint, plastic, printing ink, rubber, leather, printing, toner for electrophotography, inkjet ink, and thermal-transfer ink.

In the case where the organic pigment composition according to the present invention is used for forming pixel portions of a color filter, the organic pigment composition according to the present invention, which includes halogenated metal C.I. Pigment Green 58 pigment as the organic pigment (A), may also include a quinophthalone pigment or an organometallic complex pigment as needed.

The organic pigment composition according to the present invention may also include organic pigment derivatives such as an sulfonic acid derivative of the organic pigment (A), an N-(dialkylamino)methyl derivative of the organic pigment (A), an N-(dialkylaminoalkyl)sulfonic acid amide derivative of the organic pigment (A), and a phtalimide alkyl derivative of the organic pigment (A); dispersants such as DISPERBYK 130, DISPERBYK 161, DISPERBYK 162, DISPERBYK 163, DISPERBYK 170, DISPERBYK 171, DISPERBYK 174, DISPERBYK 180, DISPERBYK 182, DISPERBYK 183, DISPERBYK 184, DISPERBYK 185, DISPERBYK 2000, DISPERBYK 2001, DISPERBYK 2020, DISPERBYK 2050, DISPERBYK 2070, DISPERBYK 2096, DISPERBYK 2150, DISPERBYK LPN21116, and DISPERBYK LPN6919 produced by BYK chemie, Efka 46, Efka 47, Efka 452, Efka LP4008, Efka 4009, Efka LP4010, Efka LP4050, LP4055, Efka 400, Efka 401, Efka 402, Efka 403, Efka 450, Efka 451, Efka 453, Efka 4540, Efka 4550, Efka LP4560, Efka 120, Efka 150, Efka 1501, Efka 1502, and Efka 1503 produced by Efka, Solsperse 3000, Solsperse 9000, Solsperse 13240, Solsperse 13650, Solsperse 13940, Solsperse 17000, 18000, Solsperse 20000, Solsperse 21000, Solsperse 20000, Solsperse 24000, Solsperse 26000, Solsperse 27000, Solsperse 28000, Solsperse 32000, Solsperse 36000, Solsperse 37000, Solsperse 38000, Solsperse 41000, Solsperse 42000, Solsperse 43000, Solsperse 46000, Solsperse 54000, and Solsperse 71000 produced by Lubrizol Corporation, and AJISPER PB711, AJISPER PB821, AJISPER PB822, AJISPER PB814, AJISPER PN411, and AJISPER PA111 produced by Ajinomoto Co., Inc.; and water-insoluble synthetic resins that are liquid at room temperature, such as acrylic resins, urethane resins, alkyd resins, natural rosins including a wood rosin, a gum rosin, and a tall rosin, modified rosins including a polymerized rosin, a disproportionated rosin, a hydrogenated rosin, an oxidized rosin, and a maleated rosin, and rosin derivatives including a rosin amine, a lime rosin, alkylene oxide adducts of a rosin, alkyd adducts of a rosin, and a rosin-modified phenol. Addition of these dispersants and resins contributes to reduction in flocculation, improvement of the dispersion stability of pigment, and improvement of the viscometric property of the dispersion.

The organic pigment composition according to the present invention may be used for any publicly known and commonly used purposes. In the case where pixel portions of a color filter include the organic pigment composition, in particular, when the average particle size of primary particles is 0.01 to 0.10 μm, pigment aggregation is relatively weak and therefore dispersibility in a synthetic resin or the like to be colored is improved.

A color filter can be formed by adding the above-described organic pigment composition according to the present invention or an organic pigment composition produced by the production method according to the present invention to R, G, and B pixel portions of a color filter. Specifically, for example, a R pixel can be produced from an organic pigment composition according to the present invention including a diketopyrrolopyrrole pigment such as C.I. Pigment Red 254; a G pixel can be produced from an organic pigment composition according to the present invention including a halogenated-metal phthalocyanine pigment such as C.I. Pigment Green 36 or 58; and a B pixel can be produced from an organic pigment composition according to the present invention including a metal phthalocyanine pigment such as C.I. Pigment Blue 15:6.

As described above, the organic pigment composition according to the present invention can be used for forming a pattern of R, G, and B pixel portions of a color filter by a publicly known method. Typically, a photosensitive composition for pixel portions of a color filter including the pigment composition for color filters pigment according to the present invention and a photosensitive resin as main components can be produced.

A color filter can be produced by, for example, a method called photolithography in which the organic pigment composition according to the present invention is dispersed in a dispersion medium composed of a photosensitive resin, the resulting dispersion is applied to a transparent substrate composed of glass or the like by a spin-coating method, a roll-coating method, an inkjet method, or the like, the resulting coating film is subjected to pattern exposure to ultraviolet light through a photomask, and then unexposed portions are cleaned with a solvent or the like to create a pattern for each color.

The color filter may be produced by forming a pattern for pixel portions of each color by another method, namely, an electrodeposition method, a transfer method, a micelle electrolysis method, or a PVED (photovoltaic electrodeposition) method. Even when the organic pigment composition according to the present invention is subjected to a thermal history, a change in hue is small. Therefore, the organic pigment composition according to the present invention is quite useful in, for example, a method for producing color filters which includes a baking step.

The photosensitive composition for pixel portions of a color filter is prepared by, for example, mixing, as main components, the organic pigment composition according to the present invention with a photosensitive resin, a photopolymerization initiator, and an organic solvent in which the above-described resin can be dissolved. The photosensitive composition is generally prepared by a method in which the organic pigment composition according to the present invention is mixed with an organic solvent and, as needed, a dispersant to prepare a dispersion and a photosensitive resin or the like is added in the dispersion.

Examples of the dispersant used as needed include DISPERBYK (registered trademark) 130, DISPERBYK 161, DISPERBYK 162, DISPERBYK 163, and DISPERBYK 170 produced by BYK chemie and Efka 46 and Efka 47 produced by Efka. A leveling agent, a coupling agent, a cationic surfactant, and the like may be used in combination.

Example of the organic solvent include aromatic-series solvents such as toluene, xylene, and methoxybenzene; acetic acid ester solvents such as ethyl acetate, butyl acetate, propylene glycol monomethyl ether acetate, and propylene glycol monoethyl ether acetate; propionate solvents such as ethoxyethyl propionate; alcohol solvents such as methanol and ethanol; ether solvents such as butyl cellosolve, propylene glycol monomethyl ether, diethylene glycol ethyl ether, and diethylene glycol dimethyl ether; ketone solvents such as methyl ethyl ketone, methyl isobutyl ketone, and cyclohexanone; aliphatic hydrocarbon solvents such as hexane; nitrogen compound solvents such as N,N-dimethyl formamide, γ-butyrolactam, N-methyl-2-pyrrolidone, aniline, and pyridine; lactone solvents such as γ-butyrolactone, carbamic acid esters such as a mixture of methyl carbamate and ethyl carbamate at a ratio of 48:52; and water. In particular, water-soluble polar solvents such as propionate solvents, alcohol solvents, ether solvents, ketone solvents, nitride compound solvents, lactone solvents, and water are suitable as the organic solvent.

The dispersion can be prepared by mixing 100 parts by mass of the organic pigment composition according to the present invention with 300 to 1000 parts by mass of the organic solvent and, as needed, 0 to 100 parts by mass of the dispersant and/or 0 to 20 parts by mass of a C.I. Pigment Green 58 derivative and stirring the mixture to uniformly disperse these compounds. Into the dispersion, 3 to 20 parts by mass of the photosensitive resin per part by mass of the organic pigment composition according to the present invention, 0.05 to 3 parts by mass of the photopolymerization initiator per part by mass of the photosensitive resin, and as needed, the organic solvent are added. The mixture is stirred so as to uniformly disperse these compounds. Thus, the photosensitive compound for pixel portions of a color filter is produced.

Examples of the photosensitive resin that can be used in this step include thermoplastic resins such as an urethane resin, an acrylic resin, a polyamic acid resin, a polyimide resin, a styrene-maleic resin, and a styrene-maleic anhydride resin; and photopolymerizable monomers such as bifunctional monomers including 1,6-hexanediol diacrylate, ethylene glycol diacrylate, neopentyl glycol diacrylate, triethylene glycol diacrylate, bis(acryloxyethoxy)bisphenol A, and 3-methylpentanediol diacrylate and polyfunctional monomers including trimethylolpropatone triacrylate, pentaerythritol triacrylate, tris(2-hydroxyethyl)isocyanate, dipentaerythritol hexaacrylate, and dipentaerythritol pentaacrylate.

Examples of the photopolymerization initiator include acetophenone, benzophenone, benzyl dimethyl ketanol, benzoyl peroxide, 2-chlorothioxantone, 1,3-bis(4'-azidobenzal)-2-propane, 1,3-bis(4'-azidobenzal)-2-propane-2'-sulfonic acid, and 4,4'-diazidostilbene-2,2'-disulfonic acid.

The photosensitive composition for pixel portion of color filters prepared as described above is subjected to pattern exposure to ultraviolet light through a photomask. Subsequently, unexposed portions are cleaned with an organic solvent, alkaline water, or the like. Thus, a color filter can be prepared.

The present invention will now be specifically described with reference to Synthesis Examples, Comparative Synthesis Examples, Examples, and Comparative Examples below. In these examples, "%" means percent by mass.

Synthesis Example 1

Into a four-necked flask equipped with a stirrer, a thermometer, a cooling tube, and a nitrogen-introduction tube, 1540 parts of propylene glycol monomethyl ether acetate was charged and heated to 110° C. in a nitrogen stream. Into the mixture, a liquid mixture of 647 parts of methyl methacrylate, 350 parts of n-butyl methacrylate, 3 parts of 2-methacryloxyethyl acid phosphate, and 18 parts of t-butylperoxy-2-ethylhexanoate (hereafter, abbreviated as TBPEH) was added dropwise over 4 hours. After the completion of dropping, the mixture was caused to react at 110° C. for 7 hours to prepare a solution of a polymer (B-1) having a nonvolatile content of 40.8% and a weight-average molecular weight of 16,000.

Synthesis Example 2

Into the same four-necked flask as in Synthesis Example 1, 1540 parts of propylene glycol monomethyl ether acetate was charged and heated to 110° C. in a nitrogen stream. Into the mixture, a liquid mixture of 997 parts of benzyl methacrylate, 3 parts of 2-methacryloxyethyl acid phosphate, and 18 parts of TBPEH was added dropwise over 4 hours. After the completion of dropping, the mixture was caused to react at 110° C. for 7 hours to prepare a solution of a polymer (B-2) having a nonvolatile content of 38.1% and a weight-average molecular weight of 14,000.

Synthesis Example 3

Into the same four-necked flask as in Synthesis Example 1, 1000 parts of isopropyl alcohol was charged and heated to 80° C. in a nitrogen stream. Into the mixture, a liquid mixture of 647 parts of methyl methacrylate, 350 parts of n-butyl methacrylate, 3 parts of 2-methacryloxyethyl acid phosphate, and 10 parts of TBPEH was added dropwise over 4 hours. One hour after the completion of dropping, 500 parts of methyl ethyl ketone was added into the mixture and the mixture was caused to react for more 6 hours to prepare a solution of a polymer (B-3) having a nonvolatile content of 39.8% and a weight-average molecular weight of 54,000.

Synthesis Example 4

Into the same four-necked flask as in Synthesis Example 1, 1000 parts of isopropyl alcohol was charged and heated to 80° C. in a nitrogen stream. Into the mixture, a liquid mixture of 647 parts of methyl methacrylate, 350 parts of n-butyl methacrylate, 3 parts of 2-methacryloxyethyl acid phosphate, and 20 parts of TBPEH was added dropwise over 4 hours. One hour after the completion of dropping, 500 parts of methyl ethyl ketone was added into the mixture and the mixture was caused to react for more 6 hours to prepare a solution of a polymer (B-4) having a nonvolatile content of 40.0% and a weight-average molecular weight of 37,000.

Example 1

Into a 1-L autoclave, 10 G of FASTOGEN GREEN A110 (polyhalogenated zinc phthalocyanine produced by DIC corporation, average primary particle size of 30 nm) and 1.25 g of the copolymer (B-2) solution (solid content of 38.1%) prepared in Synthesis Example 1 were charged with 589 g of water. The mixture was heated to 130° C. in 1.5 hours under stirring, and then maintained at the temperature for 1 hour under stirring to perform a resin treatment on the surface of the pigment. After being left to cool to room temperature, the mixture was subjected to suction filtration and then cleaned with 2 L of hot water. The resulting wet cake was dried at 90° C. for 12 hours and then crushed in a lab mill to prepare an organic pigment composition.

Comparative Example 1

An organic pigment composition was prepared as in Example 1 except that HYDRAN AP-40F (an aqueous polyurethane dispersion produced by DIC Corporation) was used instead of 1.25 g of the copolymer (B-2) solution (solid content of 38.1%) prepared in Synthesis Example 2 so that the amount of HYDRAN AP-40F was equal to the amount of the copolymer (B-2) in terms of nonvolatile component.

Example 2

With 1.24 parts of BYK-LPN6919 produced by BYK chemie (a dispersant produced by BYK chemie), 1.86 parts of UNIDIC ZL295 (an acrylic resin produced by DIC corporation), and 10.92 parts of propylene glycol monomethyl ether acetate, 2.48 parts of the organic pigment composition prepared in Example 1 was dispersed for 2 hours with a paint conditioner produced by Toyo Seiki Seisakusho, Ltd. using zircon beads having a size of 0.3 to 0.4 mm.

Into 4.0 parts of the resulting coloring composition (I), 2.10 parts of UNIDIC ZL295 and 2.00 parts of propylene glycol monomethyl ether acetate were added and mixed using the paint conditioner to prepare an evaluation composition used for forming green pixel portions for a color filter.

This evaluation composition was spin-coated on a soda glass while changing the film thickness and dried at 90° C. for 3 minutes to prepare an evaluation glass-substrate. Using the glass substrate, chromaticity (x, y) and brightness (Y) for illuminance C was determined with MCPD-3000 produced by Otsuka Electronics Co., Ltd. In addition, the chromaticity and the brightness (Y) of the evaluation glass-substrate that was heated at 230° C. for 1 hour were also determined.

Comparative Example 2

The same series of operations was carried out as in Example 2 except that the organic pigment composition prepared in Comparative Example 1 was used instead of 3.48 parts of the organic pigment composition prepared in Example 1. Thus, an evaluation glass-substrate was prepared and subjected to the same measurement as in Example 2.

Table 1 shows the evaluation results in Example 2 and Comparative Example 2. Note that, "After PB" in Table 1 means "after heating at 230° C. for 1 hour".

TABLE 1

|  | Brightness Y (y 0.500) | | | Chromaticity x (y 0.500) | | |
| --- | --- | --- | --- | --- | --- | --- |
|  | Initial | After PB | Δy | Initial | After PB | Δx |
| Example 2 | 60.17 | 60.86 | 0.69 | 0.2441 | 0.2506 | 0.0065 |
| Comparative Example 2 | 60.07 | 61.03 | 0.96 | 0.244 | 0.2515 | 0.0075 |

As shown in the comparison between Example 2 and Comparative Example 2 shown in Table 1, the copolymer (B) of a (meth)acrylic acid ester having a phosphate group used in the present invention has a smaller difference in brightness and chromaticity between the initial value and the value measured after PB and therefore clearly has better heat resistance than conventionally used polyurethane resins.

INDUSTRIAL APPLICABILITY

According to the present invention, a distinctive heat resistance is realized due to the interaction between the organic pigment (A) having an average primary particle size of 100 nm or less and the copolymer (B) of a (meth)acrylic acid ester having a phosphate group and another (meth)acrylic acid ester having no phosphate group per 100 parts of the organic pigment (A) on a mass basis. As a result, a coloring item with which a change in hue is small even when subjected to a thermal history can be produced. Specifically, when the coloring item is used for preparation of pixel portions for a color filter, a liquid-crystal display apparatus that has high brightness and that is capable of liquid-crystal display with high brightness even when subjected to a thermal history for a prolonged period can be produced.

The invention claimed is:
1. A color filter, comprising a pixel portion, the pixel portion comprising a photosensitive composition comprising an organic pigment (A) having an average primary particle size of 100 nm or less; and a copolymer (B) of a (meth)acrylic acid ester having a phosphate group and another (meth)acrylic acid ester having no phosphate group, the amount of a nonvolatile component of the copolymer (B) being 0.1 to 15 parts relative to 100 parts of the organic pigment (A) on a mass basis.
2. The color filters according to claim 1, wherein the organic pigment (A) is C.I. Pigment Green 58.
3. A method for producing the color filter according to claim 1, the method comprising, in a liquid medium, heating under pressure the organic pigment (A) in the presence of a nonvolatile component of a copolymer (B) of a (meth) acrylic acid ester having a phosphate group and another (meth)acrylic acid ester having no phosphate group; or solvent-salt-milling the organic pigment (A) in the presence of the nonvolatile component of the copolymer (B) of a (meth)acrylic acid ester having a phosphate group and another (meth)acrylic acid ester having no phosphate group.

4. The method for producing the color filters according to claim 3, wherein the organic pigment (A) is C.I. Pigment Green 58.

5. A color filter comprising a pixel portion, the pixel portion comprising a photosensitive composition comprising an organic pigment composition, the organic pigment composition being produced by the method according to claim 3.

6. The color filter according to claim 1, wherein the copolymer (B) is a copolymer having a glass-transition temperature of at least 0° C. and no more than 150° C.

7. The color filter according to claim 1, wherein a monomer having a phosphate group in the copolymer (B) is in an amount of at least 3% and no more than 35% by mass based on 100% of all the monomers of copolymer (B).

8. The color filter according to claim 1, wherein the organic pigment is selected from the group consisting of diketopyrrolopyrrole pigments; azo pigments; phthalocyanine pigments; anthraquinone pigments; quinacridone pigments; dioxazine pigments; perinone pigments; perylene pigments; thioindigo pigments; isoindoline pigments; isoindolinone pigments; quinophthalone pigments and threne pigments.

9. The color filter according to claim 1, wherein the photosensitive composition further includes a photosensitive resin.

10. The color filter according to claim 9, wherein the photosensitive resin is selected from the group consisting of urethane resin, an acrylic resin, a polyamic acid resin, a polyimide resin, a styrene-maleic resin, a styrene-maleic anhydride resin and photopolymerizable monomers.

11. A liquid crystal display comprising the color filter according to claim 1.

* * * * *